United States Patent
Petrarca et al.

(10) Patent No.: US 7,541,277 B1
(45) Date of Patent: Jun. 2, 2009

(54) STRESS RELAXATION, SELECTIVE NITRIDE PHASE REMOVAL

(75) Inventors: Kevin Shawn Petrarca, Newburgh, NY (US); John Charles Petrus, Stanfordville, NY (US); Karl W. Barth, Poughkeepsie, NY (US); Kaushik A. Kumar, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/112,457

(22) Filed: Apr. 30, 2008

(51) Int. Cl.
H01L 21/4763 (2006.01)
(52) U.S. Cl. .................. 438/619; 438/618; 438/620; 438/621; 438/622; 438/623
(58) Field of Classification Search .......... 438/618–623
See application file for complete search history.

(56) References Cited

U.S. PATENT DOCUMENTS

| | | | |
|---|---|---|---|
| 4,104,090 A | 8/1978 | Pogge | |
| 4,987,101 A | 1/1991 | Kaanta et al. | |
| 5,461,003 A * | 10/1995 | Havemann et al. | 438/666 |
| 5,670,298 A | 9/1997 | Hur | |
| 6,180,456 B1 | 1/2001 | Lam et al. | |
| 6,190,988 B1 | 2/2001 | Furukawa et al. | |
| 6,440,753 B1 | 8/2002 | Ning et al. | |
| 6,492,732 B2 * | 12/2002 | Lee et al. | 257/758 |
| 6,514,881 B1 | 2/2003 | Coffman | |
| 6,737,747 B2 | 5/2004 | Barth et al. | |
| 6,753,258 B1 | 6/2004 | Gaillard et al. | |
| 6,831,366 B2 | 12/2004 | Gates et al. | |
| 6,930,034 B2 | 8/2005 | Colburn et al. | |
| 6,939,797 B2 | 9/2005 | Barth et al. | |
| 6,946,382 B2 | 9/2005 | Townsend, III et al. | |
| 6,949,459 B2 | 9/2005 | Li et al. | |
| 7,071,091 B2 | 7/2006 | Clarke et al. | |
| 7,094,669 B2 | 8/2006 | Bu et al. | |
| 7,217,649 B2 | 5/2007 | Bailey, III et al. | |
| 7,238,604 B2 | 7/2007 | Kloster et al. | |
| 7,300,868 B2 | 11/2007 | Fukasawa et al. | |
| 2004/0063305 A1 * | 4/2004 | Kloster et al. | 438/619 |
| 2004/0127001 A1 | 7/2004 | Colburn et al. | |
| 2005/0037606 A1 | 2/2005 | Farnworth et al. | |
| 2005/0106852 A1 * | 5/2005 | Park et al. | 438/619 |
| 2005/0242414 A1 | 11/2005 | Angyal et al. | |
| 2006/0228836 A1 | 10/2006 | Yang et al. | |
| 2007/0066047 A1 | 3/2007 | Ye et al. | |
| 2007/0196987 A1 | 8/2007 | Chidambarrao et al. | |
| 2007/0259516 A1 | 11/2007 | Jahnes et al. | |
| 2008/0026541 A1 | 1/2008 | Endelstein et al. | |

OTHER PUBLICATIONS

J. Kim et al., "Sub-0.1 μm nitride hard mask open process without procuring the ArF photoresist", J. Vac. Sci. Technol. B 21(2), Mar./Apr. 2003; American Vacuum Society, pp. 790-794.

* cited by examiner

Primary Examiner—Kevin M. Picardat
Assistant Examiner—Bac H Au
(74) Attorney, Agent, or Firm—Saidman Design Law Group

(57) ABSTRACT

A method for forming a dielectric cap layer over an interconnect layer formed by a back-end-of-the-line (BEOL) interconnect process, the interconnect process including: lithography, reactive ion etching (RIE), metal filling of BEOL conductors, and chemical-mechanical polishing (CMP), wherein a sacrificial material resides between conductors of the interconnect layer, and wherein the dielectric cap layer is made porous through an oxidation process.

1 Claim, 2 Drawing Sheets

STRESS RELAXATION, SELECTIVE NITRIDE PHASE REMOVAL

BACKGROUND OF THE INVENTION

1. Field of the Invention

The present invention generally relates to stress relaxation of a silicon nitride dielectric film and selective silicon nitride phase removal of the same. More particularly, the invention relates to methods for depositing a porous silicon nitride film as an etch mask and removing a sacrificial inter-level dielectric (ILD) silicon nitride layer through the porous film silicon nitride film.

2. Description of the Related Art

There are many materials that are low-K materials (a small dielectric constant relative to silicon dioxide), with the lowest K being porous materials or materials capable of forming air bridges/gaps. In an etching process, dielectric caps are formed over an interconnect layer that will subsequently have a porosity that will allow evacuation of a material that resides between conductors.

Methods to create an air bridge/gap utilize a porous spin-on material, self assembly spin-on materials, or a combination of lithography and reactive ion etching (RIE) materials.

Some porous spin-on materials are inherently weak, and lead to structural failure. Some self assembly spin-on materials have to be removed after a lower cap layer has been RIE'd through and an ability of such a material to self-assemble is dependent on a thickness of a polymer which does not lend itself well if there is topography on a wafer. Lithography and RIE materials have to overcome overlay of dimension specifications. For example, if line/space dimensions are near a lithography minimum limit there would be no offset in an overlay tolerance.

SUMMARY OF THE INVENTION

An embodiment of the present invention provides a method and a structure for porous back-end-of-the-line (BEOL) insulators to lower a dielectric constant of an insulator and to reduce resistive-capacitive (RC) delay. The nitride is made porous without removal, and thus relieving stress.

An embodiment of the present invention provides a porous silicon nitride material which can be used as an etch mask for the removal of a sacrificial ILD layer there-through. A cap is formed over an interconnect layer where the sacrificial material resides between conductors. The dielectric cap layer is made porous through an oxidation process.

In another embodiment, adhesion is enhanced in oxide levels.

In an embodiment of the present invention, a chemistry includes $CF_4O_2$ and $H_2O$. The amount of moisture determines the extent of the nitride.

Furthermore, embodiments of the present invention can be directed to a system including a deposition apparatus, an etching apparatus, a lithography apparatus, and a logic or memory element. In addition, embodiments of the present invention can also be implemented as a program causing a computer to execute the above-described steps. The program can be distributed via a computer-readable storage medium such as a CD-ROM.

DETAILED DESCRIPTION OF EMBODIMENTS OF THE INVENTION

Figure 1:
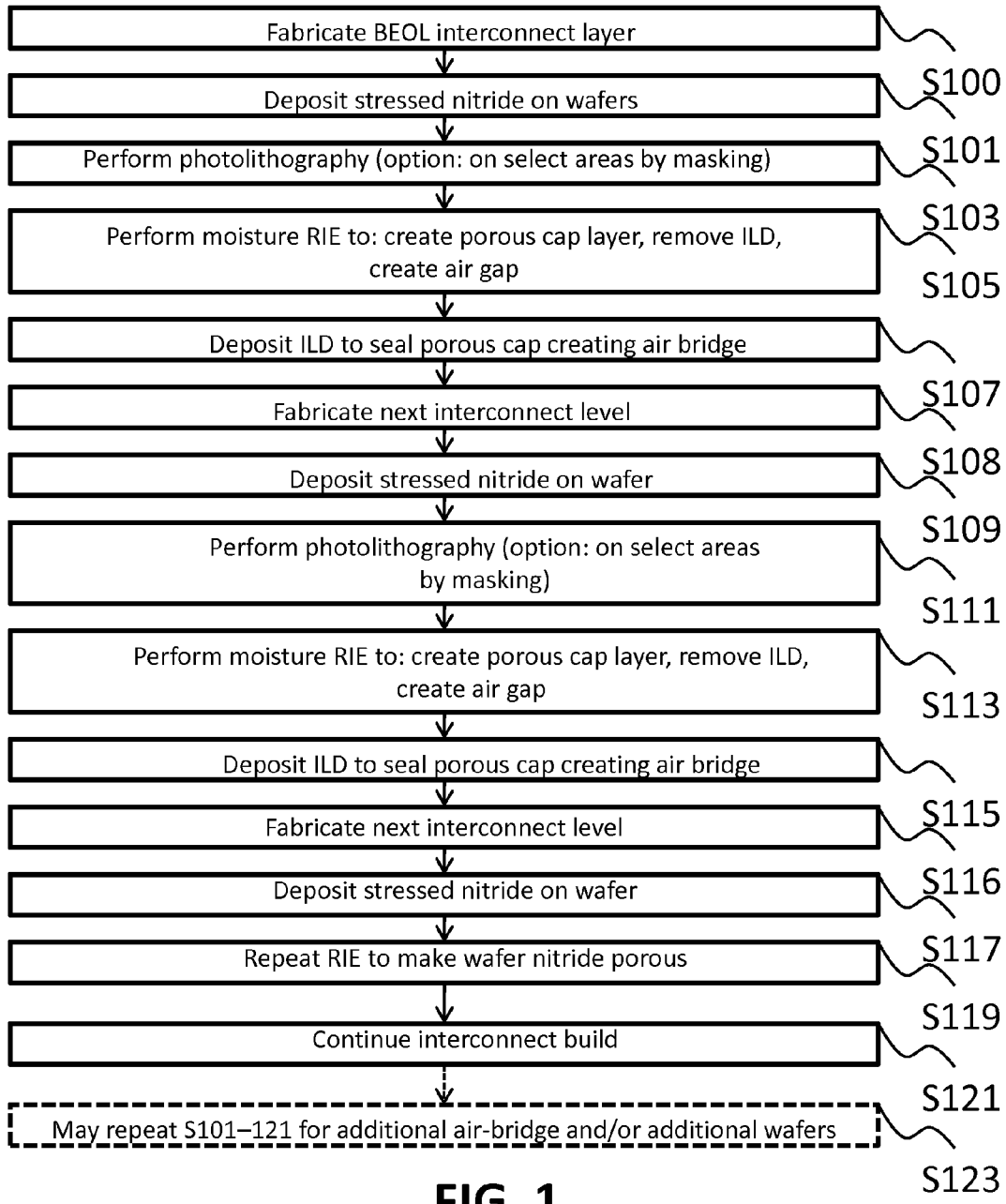
FIG. 1 is a flowchart of a method according to an embodiment of the invention.

In the description that follows, numerous details are set forth in order to provide a thorough understanding of the present invention. It will be appreciated by those skilled in the art that variations of these specific details are possible while still achieving the results of the present invention. Well-known elements and processing steps are generally not described in detail in order to avoid unnecessarily obscuring the description of the present invention.

In the drawings accompanying the description that follows, often both reference numerals and legends (labels, text descriptions) may be used to identify elements. If legends are provided, they are intended merely as an aid to the reader, and should not in any way be interpreted as limiting.

An embodiment of this invention creates air gaps and air bridges by providing a porous etch mask for evacuating a layer of insulator. More specifically, as shown below, an embodiment of the present invention includes a method for forming a dielectric cap layer over an interconnect layer formed by a back-end-of-the-line (BEOL) interconnect process, the interconnect process including: lithography, reactive ion etching (RIE), metal filling of conductors, and chemical-mechanical polishing (CMP), wherein a sacrificial material resides between conductors of the interconnect layer, and wherein the dielectric cap layer is made porous through an oxidation process including RIE.

Thermal oxidation of silicon wafers generates stress in a dielectric film formed thereon. Two common reasons for the stress include: molecules of the dielectric film take more volume than the silicon atoms; and a mismatch between coefficients of thermal expansion of the wafer and the dielectric film.

In an embodiment of the invention, at least two nitride-covered wafers were processed in a laboratory, one nitride layer having compressive stress and one nitride layer having tensile stress. The stress levels vary during deposition, with compressive stress occurring at higher power and lower pressure, and tensile stress occurring at lower power and higher pressure. Heating a semiconductor substrate during deposition is sometimes used to reduce dielectric film stress. In plasma-enhanced chemical vapor deposition (PECVD), the semiconductor substrate temperature is typically near 300° C., though plasma deposition of silicon nitrides at room temperature is possible.

Silicon nitride is commonly used as a dielectric for the passivation of electronic devices because it forms a good protective barrier against diffusion of water, sodium and copper ions. In micromachining, PECVD $Si_xN_y$ films are also effective as etch masks.

Etching and deposition typically alternate in an inductively coupled plasma reactive ion etching (RIE) process. In the deposition step, $Si_xN_y$ is plasma-deposited by reacting $CF_4O_2$ and $H_2O$ in a PECVD chamber. In the etching step, $CF_4$ and $O_2$ are reacted with a 0.2–5% $H_2O$ concentration to achieve a humidity/moisture in the $O_2$ using a bubbler or an atomizer. A roughening of a surface of the $Si_xN_y$ cap layer is caused and gaps/openings of between 5-30 nanometers are created in the $Si_xN_y$ cap layer.

Since low-k dielectrics are fragile and are susceptible to both delamination and scratching (increased defects), and there was V-V delamination for lead-free quals, a roughened surface can provide additional surface area for a nitride-oxide interface.

A PECVD nitride has the ability to control stress during deposition. Low moisture results in a small surface change, and with high moisture the silicon nitride can almost completely be removed (approximately a 700 Å thick film was used).

Pores in dielectric materials can lower the dielectric constant. Low-k dielectric materials can typically be deposited either with or without pores, depending on process conditions. Since air has a near 1 dielectric constant, porous films exhibit reduced dielectric constants as compared with the dielectric constants of the base material in which they are developed. Generally, it is the spin-on materials (e.g., SiLK™, GX-3p™, or other porous low-k dielectric materials with pore structure leading to a rough etch front and/or rough line and via sidewalls due to the size or distribution of porosity) that exhibit a high degree of porosity. PECVD materials generally do not exhibit such a high degree of porosity due to the method of deposition. Materials of this kind are described in Patent Cooperation Treaty International Patent Application WO 00/31183 entitled "A composition containing a crosslinkable matrix precursor and a porogen and a porous matrix prepared therefrom" by Kenneth, J. Bruza et al., which is assigned to The Dow Chemical Company, the contents of which are incorporated herein by reference in their entirety as if fully set forth.

However, as discussed above, a layer of insulator can be exposed/evacuated through a porous etch mask by any etching process, not necessarily limited to RIE, but also including plasma etching, an etching process that includes the addition of hydrogen to a $C_xF_y$ gas, and the like. The material for the porous etch mask can be any material that selectively withstands the sacrificial material extraction process, of such materials as diamond-like carbon (DLC), cross-linked organic polymers (aliphatic and aromatic), porous organic films (aliphatic and aromatic), polyimides, SILK™, for example.

A porous silicon nitride functions as a partition/sectioning member and has many pores. In the method according to an embodiment of this invention, a silicon nitride layer is sectioned to determine a depth of the pores which were sublithographic in size, approximately 100-200 Å deep and 10-20 Å wide. The pores/perforations in this ILD "bridge" are so small that they will be "pinched-off" to seal cavities on the semiconductor wafer. Therefore, sealing of gaps can be achieved without the additional cost of lithography. The pores/perforations may be filled in, or "pinched-off," by various deposition processes to form enclosed air gaps. Thus, a porous silicon nitride can be used to form and enclose air gaps, as a stress nitride process much like that used for N-type or P-type FETs without removal, or to enhance adhesion in oxide levels (particularly for lead-free quals). If desired, in the pinch-off step the material may be planarized by a process such as chemical mechanical polishing (CMP), or by application of a planarizing dielectric followed by RIE. A pinched-off bridge layer is then opened in selected areas for conductive contacts. Note that the contents of enclosed air gaps may include Ar, $O_2$, $N_2$, He, $CO_2$, $SF_6$, $CF_4$, other gases, vacuum, or mixtures thereof, and that conductive contacts may alternatively have the form of vias for interconnection of additional wiring levels.

FIG. 1 is a representative flowchart describing a method of an embodiment of the invention. At (S100), a BEOL interconnect layer is fabricated. At an m1 level an ILD film is deposited (S101) (which will subsequently have BEOL interconnects formed thereon), and then lithography (S103) is performed as an option of protecting areas that it is not desirable to affect, by masking. Next, "moisture" RIE is performed to create a porous cap through which the m1 ILD can be removed creating an air gap (S105). After formation of the air gaps another ILD is deposited to create an air bridge (S107) and a next interconnect level is fabricated at (S108). Next, a stressed nitride deposition (S109) is performed to a thickness of between 100-250 Å. The wafer is optionally covered with photoresist for masking, another photolithography is performed (S111), and another moisture RIE is performed, which makes the second nitride porous (S113), thus relieving stress. Then the second ILD can be removed through the second stressed nitride layer that was made porous. An embodiment of this invention provides for a compressive film with a low dielectric constant that can be inserted and retained between each metallization level, thereby, reducing a propensity of a multilayer dielectric to cracking by countering the tensile stress of the low-k CVD ILD and thus uniquely enhancing the reliability and manufacturability of the low-k CVD stack. Thus, a porous silicon nitride film include properties such as, high polish selectivity, good barrier to moisture and oxygen, minimized damage to the underlying low-k CVD dielectric, and provides adhesion to the underlying low-k CVD dielectric. The porous silicon nitride film is also capable of being deposited in the same platform/tool as the underlying low-k CVD dielectric.

Further, this method, which produces a structure having enclosed air-gaps, may further include: applying a selective cap deposition, during air-gap formation, to at least partially fill or plug at least one of: perforations formed in a cap layer arranged above exposed portions of an interconnect, openings formed in a cap layer arranged above exposed portions of an interconnect, nano-holes formed in a cap layer arranged above exposed portions of an interconnect, and voids formed in an interconnect.

An embodiment of the interconnect structure of this invention may include a semiconductor substrate which may contain logic circuit or memory elements; a dielectric layer, commonly known as an inter-layer dielectric (ILD), which may be deposited, overlying the semiconductor substrate; an adhesion promoter layer may be disposed between the semiconductor substrate and ILD layer; a dielectric cap layer disposed on the ILD layer; at least one conductor embedded in the ILD layer and the dielectric cap layer; and a diffusion barrier liner may be disposed between the ILD layer and the conductor.

In (S115), an ILD is deposited to seal the porous $Si_xN_y$ cap, creating the air-bridge and a next interconnect level is fabricated at (S116). In (S117), a stressed nitride is deposited on the wafer. After (S119), processing may continue to build an interconnect layer (S121). Further, (S100-S121) may be repeated to create additional air bridges or for processing additional wafers (S123).

Figure 2A:
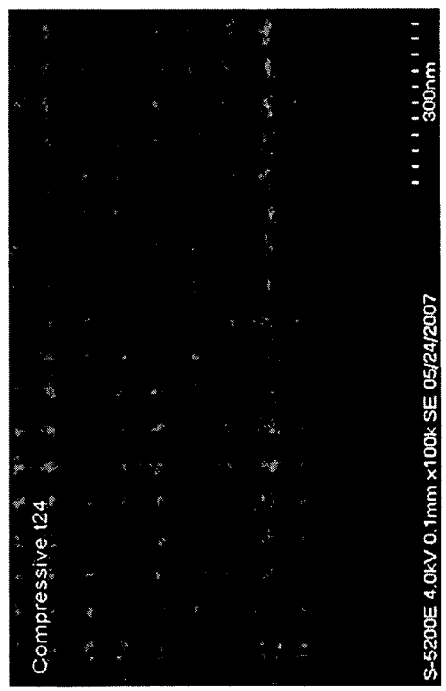
FIGS. 2A-C show exemplary results of the method according to an embodiment of the invention.
Figure 2C:
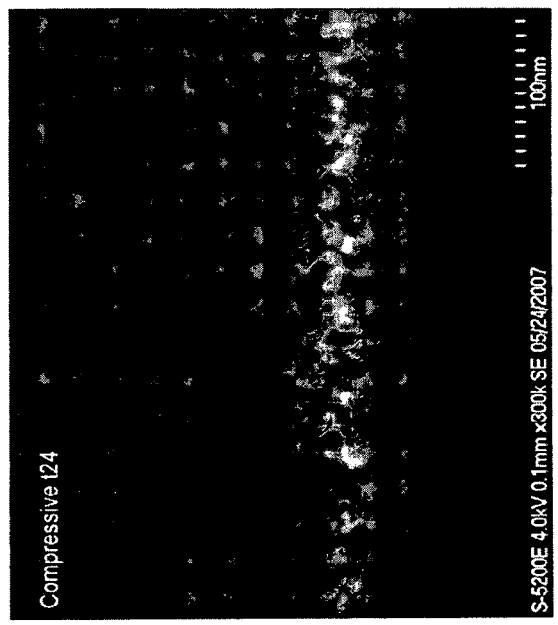
Figure 2B:
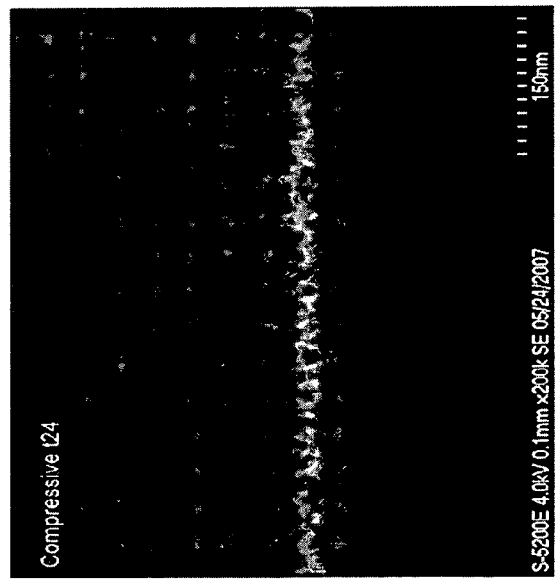

With reference now to FIGS. 2A-C a scanning electron micrograph of the results of the method according to an embodiment of the invention is shown.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While an embodiment of the invention has been described in terms of disclosed embodiments, those skilled in the art will recognize that the invention can be practiced with modification within the spirit and scope of the appended claims.

What is claimed is:

1. Method for forming a dielectric cap layer over an interconnect layer formed by a back-end-of-the-line (BEOL) interconnect process, the interconnect process including: lithography, reactive ion etching (RIE), metal filling of conductors, and chemical-mechanical polishing (CMP), wherein a sacrificial material resides between conductors of the interconnect layer, and wherein the dielectric cap layer is made porous through an oxidation process including RIE, the method comprising:
    depositing a first insulating material on a substrate having a plurality of logic elements formed thereon;
    performing a first RIE process using $CF_4$ and $O_2$ with a concentration between 2-5% $H_2O$ to achieve a humidity in the $O_2$ using at least one of a bubbler and an atomizer to cause a roughening of a surface of the first insulating material and to create openings having a thickness between 5-30 nanometers in the first insulating material;
    forming the dielectric cap layer by depositing a silicon nitride ($Si_xN_y$) cap layer to a thickness of between 100-250 Angstroms on the first insulating material;
    performing a second RIE process using $CF_4$ and $O_2$ with a concentration between 2-5% $H_2O$ to achieve a humidity in the $O_2$ using at least one of a bubbler and an atomizer to cause a roughening of a surface of the $Si_xN_y$ cap layer and to create openings having a thickness between 5-30 nanometers in the $Si_xN_y$ cap layer;
    evacuating a sacrificial material between the conductors of the interconnect layer; and
    depositing a second insulating material to seal the $Si_xN_y$ cap layer, wherein a subsequent air-bridge is formed below the second insulating material while not filling the air-gap.

* * * * *